(12) United States Patent
Kim et al.

(10) Patent No.: US 11,387,835 B1
(45) Date of Patent: Jul. 12, 2022

(54) PHASE-LOCKED LOOP CAPABLE OF COMPENSATING POWER NOISE

(71) Applicants: SK hynix Inc., Icheon (KR); Seoul National University R&DB Foundation, Seoul (KR)

(72) Inventors: Hyojun Kim, Seoul (KR); Deog-Kyoon Jeong, Seoul (KR)

(73) Assignees: SK hynix Inc., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 17/512,483

(22) Filed: Oct. 27, 2021

(30) Foreign Application Priority Data

Feb. 1, 2021 (KR) .................... 10-2021-0013873

(51) Int. Cl.
 *H03L 7/093* (2006.01)
(52) U.S. Cl.
 CPC .................... *H03L 7/093* (2013.01)
(58) Field of Classification Search
 CPC ........................................ H03L 7/093
 USPC ........................................ 327/158
 See application file for complete search history.

(56) References Cited

U.S. PATENT DOCUMENTS

| | | | | |
|---|---|---|---|---|
| 6,140,881 A * | 10/2000 | Kim | ........... | H03L 7/18 331/25 |
| 6,512,419 B1 * | 1/2003 | Adams | ........... | H03F 3/45659 331/8 |
| 6,870,411 B2 * | 3/2005 | Shibahara | ........... | H03L 7/0891 327/158 |
| 7,053,684 B1 | 5/2006 | Sen et al. | | |
| 7,184,510 B2 * | 2/2007 | Jung | ........... | H02M 3/07 375/376 |
| 7,298,219 B2 * | 11/2007 | Dosho | ........... | H03L 7/0898 331/25 |

(Continued)

FOREIGN PATENT DOCUMENTS

| EP | 3952114 A1 * | 2/2022 | ........... H03L 7/091 |
|---|---|---|---|
| KR | 102026371 B1 | 11/2019 | |

OTHER PUBLICATIONS

J. Liu et al., "A 0.012mm2 3.1mW Bang-Bang Digital Fractional-N PLL with a Power-Supply-Noise Cancellation Technique and a Walking-One-Phase-Selection Fractional Frequency Divider," ISSCC, pp. 268-269, Feb. 2014.

(Continued)

*Primary Examiner* — Adam D Houston

(57) ABSTRACT

A phase-locked loop includes a bias circuit controlling a first bias current between a first power source and a first node according to a bias control signal; an oscillation circuit coupled between the first node and a second power source and generating an oscillation signal according to a current from the first node; a duplicate bias circuit controlling a second bias current between the first power source and a second node according to the bias control signal; an equivalent impedance circuit coupled between the second node and the second power source; a comparator circuit comparing voltages of the first node and the second node; a first variable current circuit controlling a current between the first node and the second power source; and a second variable current circuit controlling a current between the second node and the second power source.

12 Claims, 6 Drawing Sheets

(56) References Cited

U.S. PATENT DOCUMENTS

| | | | | |
|---|---|---|---|---|
| 7,443,252 | B2* | 10/2008 | Tu | H03L 7/18 |
| | | | | 331/16 |
| 7,795,935 | B2* | 9/2010 | Schneider | H03L 7/07 |
| | | | | 327/158 |
| 8,289,062 | B2* | 10/2012 | Lin | H03H 11/26 |
| | | | | 327/158 |
| 8,773,184 | B1* | 7/2014 | Petrov | H03L 7/093 |
| | | | | 327/148 |
| 9,236,871 | B1* | 1/2016 | Hu | H03L 7/093 |
| 9,843,324 | B1* | 12/2017 | Hafizi | H03K 19/017545 |
| 10,447,284 | B1* | 10/2019 | Chen | H03L 7/0992 |
| 2007/0046343 | A1* | 3/2007 | Kurd | H03K 3/0322 |
| | | | | 327/156 |
| 2008/0088379 | A1 | 4/2008 | Chen | |
| 2010/0315138 | A1* | 12/2010 | Namba | H03L 7/197 |
| | | | | 327/157 |
| 2012/0194238 | A1* | 8/2012 | Maneatis | H03L 7/089 |
| | | | | 327/157 |
| 2013/0076450 | A1* | 3/2013 | Rao | H03L 7/0896 |
| | | | | 331/34 |
| 2014/0043074 | A1* | 2/2014 | Rofougaran | H03L 7/08 |
| | | | | 327/156 |
| 2018/0212611 | A1* | 7/2018 | Shen | H03L 7/093 |
| 2019/0348091 | A1* | 11/2019 | Park | G11C 7/1066 |
| 2020/0195255 | A1* | 6/2020 | Fan | H03L 7/093 |
| 2020/0403623 | A1* | 12/2020 | Wu | H03L 7/18 |

OTHER PUBLICATIONS

A. Elshazly et al., "A 0.4-to-3GHz Digital PLL with Supply-Noise Cancellation Using Deterministic Background Calibration," ISSCC, pp. 92-93, Feb. 2011.

C.-W. Yeh et al., "A 3.2GHz Digital Phase-Locked Loop with Background Supply-Noise Cancellation," ISSCC, pp. 332-333, Feb. 2016.

K.-C. Huang et al., "A 2.4GHz ADPLL with Digital-Regulated Supply-Noise-Insensitive and Temperature-Self-Compensated Ring DCO," ISSCC, pp. 270-271, Feb. 2014.

D.-H. Oh et al., "A 2.8Gb/s all-digital CDR with a 10b monotonic DCO", ISSCC, pp. 222-223, Feb. 2007.

D. Kim and S. Cho, "A Supply Noise Insensitive PLL with a Rail-to-Rail Swing Ring Oscillator and a Wideband Noise Suppression Loop," in Proc. IEEE Int. Symp. VLSI Circuits, pp. C180-C181, 2017.

A. Arakali et al., "Low-Power Supply-Regulation Techniques for Ring Oscillators in Phase-Locked Loops Using a Split-Tuned Architecture," IEEE JSSC, vol. 44, No. 8, pp. 2169-2181, 2009.

* cited by examiner

\<Prior Art\>

US 11,387,835 B1

PHASE-LOCKED LOOP CAPABLE OF COMPENSATING POWER NOISE

CROSS-REFERENCE TO RELATED APPLICATION

The present application claims priority under 35 U.S.C. § 119(a) to Korean Patent Application No. 10-2021-0013873, filed on Feb. 1, 2021, which is incorporated herein by reference in its entirety.

BACKGROUND

1. Technical Field

Various embodiments generally relate to a phase-locked loop capable of compensating power noise.

2. Related Art

FIG. 1 is a block diagram showing a conventional phase-locked loop 1.

The conventional phase-locked loop 1 includes a phase frequency detector 2, a loop filter 3, a bias circuit 4, an oscillation circuit 5, and a divider 6.

The phase frequency detector 2 compares a reference clock signal CLKR and a feedback clock signal CLKF.

The loop filter 3 generates a bias control signal according to an output of the phase frequency detector 2.

The loop filter 3 may be a digital loop filter and may operate in synchronization with the feedback clock signal CLKF.

The bias circuit 4 adjusts the bias current provided from a first power source VDD according to the bias control signal.

The oscillation circuit 5 is coupled between the bias circuit 4 and a second power source VSS to generate an oscillation signal according to the bias current.

The divider 6 divides the oscillation signal output from the oscillation circuit 5 and outputs the feedback clock signal CLKF.

In the conventional phase-locked loop, it is difficult to stably generate the oscillation signal because of changes in the bias current caused by power noise.

SUMMARY

In accordance with an embodiment of the present disclosure, a phase-locked loop may include a phase frequency detector configured to compare a reference clock signal and a feedback clock signal and to output a detection signal; a loop filter configured to filter the detection signal and output a bias control signal; a bias circuit configured to control a first bias current between a first power source and a first node according to the bias control signal; an oscillation circuit coupled between the first node and a second power source and configured to generate an oscillation signal according to a current from the first node; a divider configured to divide the oscillation signal and to output the feedback clock signal; a duplicate bias circuit configured to control a second bias current between the first power source and a second node according to the bias control signal; an equivalent impedance circuit coupled between the second node and the second power source; a comparator circuit configured to compare respective voltages of the first node and the second node; a first variable current circuit configured to control a current between the first node and the second power source according to an output of the comparator circuit; and a second variable current circuit configured to control a current between the second node and the second power source according to the output of the comparator circuit.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
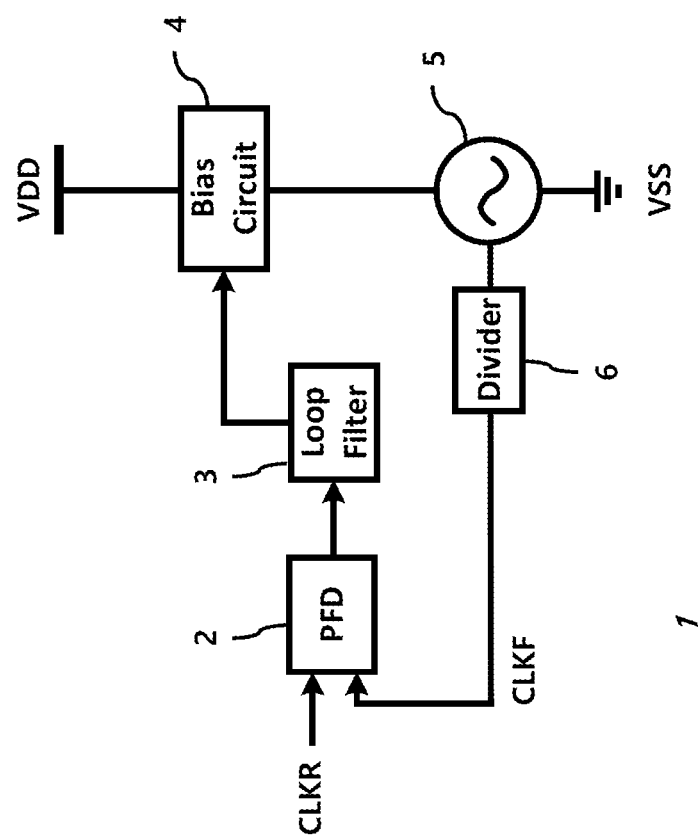
FIG. 1 illustrates a conventional phase-locked loop.
Figure 2:
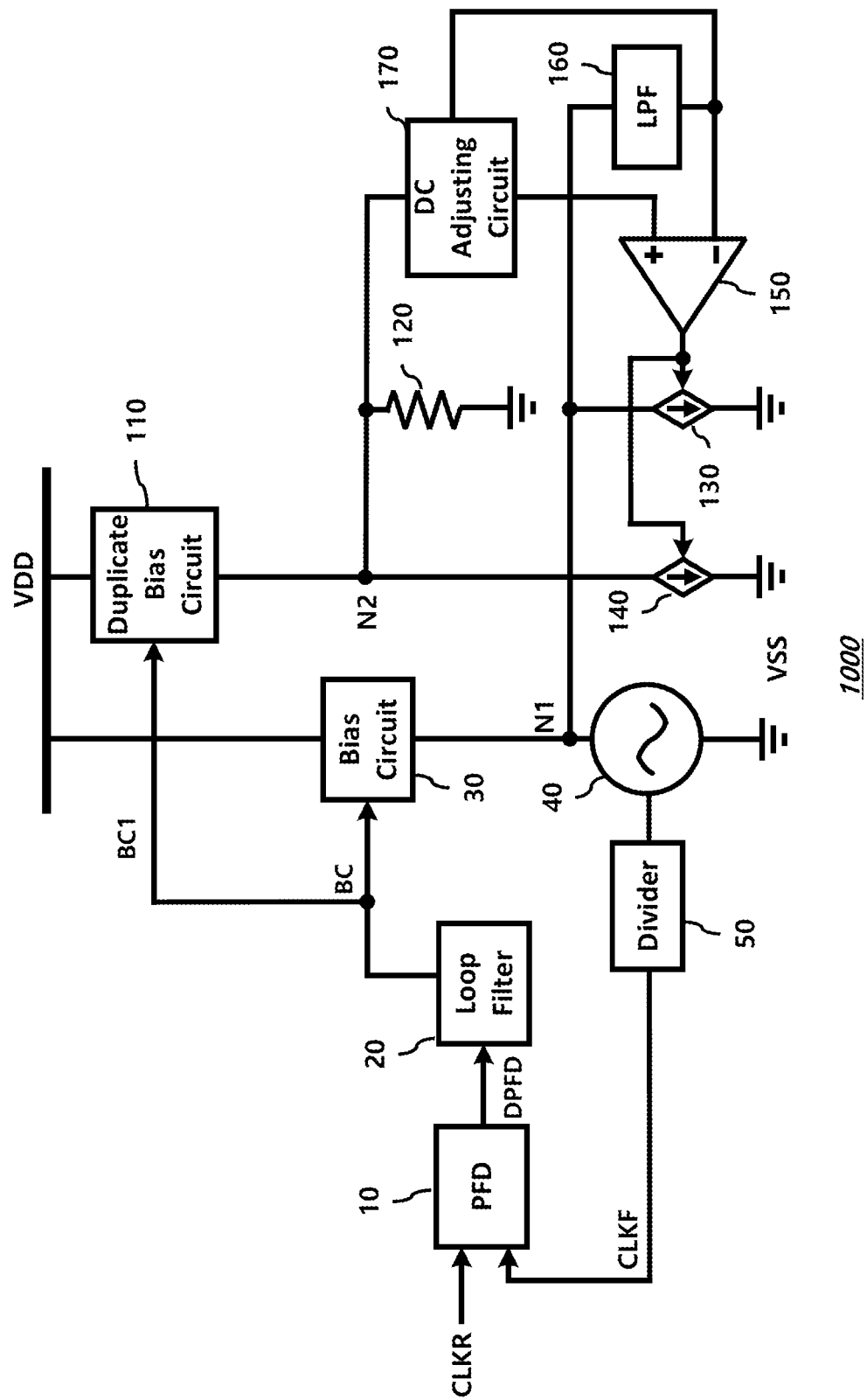
FIG. 2 illustrates a phase-locked loop according to an embodiment of the present disclosure.

FIG. 2 is a block diagram illustrating a phase-locked loop 1000 according to an embodiment of the present disclosure.

The phase-locked loop 1000 includes a phase frequency detector 10, a loop filter 20, a bias circuit 30, an oscillation circuit 40, and a divider 50.

The phase frequency detector 10 compares phase and frequency of the reference clock signal CLKR and the feedback clock signal CLKF, and outputs a detection signal DPFD.

The loop filter 20 generates a bias control signal BC according to the detection signal DPFD.

In the present embodiment, the loop filter 20 may operate at higher frequency than that of the feedback clock signal CLKF.

In this embodiment, the bias control signal BC may control the bias circuit 30 to adjust a first bias current between the first power source VDD and a first node N1.

A resistance of the bias circuit 30 may be adjusted according to the bias control signal BC.

The oscillation circuit 40 is coupled between the bias circuit 30 and the second power source VSS to generate an oscillation signal according to the first bias current.

The frequency of the oscillation signal is adjusted according to the first bias current provided by the bias circuit 30.

The divider 50 divides the oscillation signal output from the oscillation circuit 40 to output the feedback clock signal CLKF.

When the first bias current changes due to a change in the first power supply voltage VDD, the frequency of the oscillation signal fluctuates and jitter may be generated.

The phase-locked loop 1000 according to the present embodiment includes an additional circuit to reduce jitter caused by variations in the first power supply voltage VDD.

The phase-locked loop 1000 further includes a duplicate bias circuit 110, an equivalent impedance circuit 120, a first variable current circuit 130, a second variable current circuit 140, and a comparator circuit 150.

The duplicate bias circuit 110 may adjust a second bias current between the first power source VDD and the second node N2 according to the bias control signal BC.

More specifically, the duplicate bias circuit 110 may adjust the second bias current between the first power source VDD and a second node N2 according to the first bias control signal BC1.

In this embodiment, the first bias control signal BC1 may be generated from the bias control signal BC.

For example, the first bias control signal BC1 may be a signal obtained by adjusting the bias control signal BC by a predetermined ratio.

The equivalent impedance circuit 120 is coupled between the second node N2 and the second power source VSS and has an impedance equivalent to that of the oscillation circuit 40.

In the illustrated embodiment, the duplicate bias circuit 110 is a circuit that duplicates the bias circuit 30 and has substantially the same impedance as that of the bias circuit 30.

In another embodiment, the equivalent impedance circuit 120 may have an impedance obtained by adjusting the impedance of the oscillation circuit 40 by a predetermined ratio.

In such an embodiment, the duplicate bias circuit 110 has substantially the same impedance as a value obtained by adjusting the impedance of the bias circuit 30 by the predetermined ratio, and thus the area occupied by the circuit may be reduced.

The first variable current circuit 130 is coupled between the first node N1 and the second power source VSS and a current thereof is adjusted according to an output of the comparator circuit 150 to adjust voltage of the first node N1.

The second variable current circuit 140 is coupled between the second node N2 and the second power source VSS, and a current thereof is adjusted according to the output of the comparator circuit 150 to adjust voltage of the second node N2.

The comparator circuit 150 compares a filtered voltage of the first node N1 and an adjusted voltage of the second node N2 to output a comparison result, and controls the first variable current circuit 130 and the second variable current circuit 140 according to the comparison result. The comparator circuit 150 may amplify the comparison result.

In the illustrated embodiment, the comparator circuit 150 outputs a low-level signal when the filtered voltage of the first node N1 is higher than the adjusted voltage of the second node N2, and the comparator circuit 150 outputs a high-level signal when the adjusted voltage of the second node N2 is higher than the filtered voltage of the first node N1.

The phase-locked loop 1000 may further include a low-pass filter 160 that filters a voltage of the first node N1 and provides the filtered voltage of the first node N1 to the comparator circuit 150.

The phase-locked loop 1000 may further include a DC adjusting circuit 170 that adjusts a DC component of the voltage of the second node N2 to be the same as DC component of voltage of the first node N1 to produce the adjusted voltage of the second node N2. For example, the DC adjusting circuit 170 may high-pass filter the voltage of the second node N2, and then add the low-pass filtered voltage of the first node N1 and the filtered voltage of the second node N2 to produce the adjusted voltage of the second node N2.

The duplicate bias circuit 110 and the equivalent impedance circuit 120 may have configurations corresponding to the bias circuit 30 and the oscillation circuit 40, and the second variable current circuit 140 may correspond to the first variable current circuit 130. In this configuration, a feedback control operation is performed so that the voltage of the second node N2 follows the voltage of the first node N1.

As described above, impedance of the duplicate bias circuit 110 is adjusted according to the first bias control signal BC1 and voltage of the second node N2 is adjusted accordingly.

The first bias control signal BC1 is generated from the bias control signal BC generated using the detection signal DPFD which includes information on the oscillation frequency of the oscillation circuit 40.

In addition, the voltage of the first node N1 is further controlled to follow the voltage of the second node N2 by operations of the comparator circuit 150, the first variable current circuit 130, and the second variable current circuit 140.

As described above, in this embodiment, a first feedback control operation for controlling the first variable current circuit 130 by the comparator circuit 150, a second feedback control operation for controlling the second variable current circuit 140 and a third feedback control operation for controlling the duplicate bias circuit 110 according to the first bias control signal BC1 are additionally performed in addition to a normal feedback control operation performed in the conventional phase-locked loop.

While additionally performing the first to third feedback control operations, fluctuation of the voltage of the first node N1 along with that of the second node N2 due to change in the first power supply voltage VDD is controlled to be stable, resulting in reduced jitters in the oscillation signal output from the oscillation circuit 40 due to change in the first power supply voltage VDD.

Figure 3:
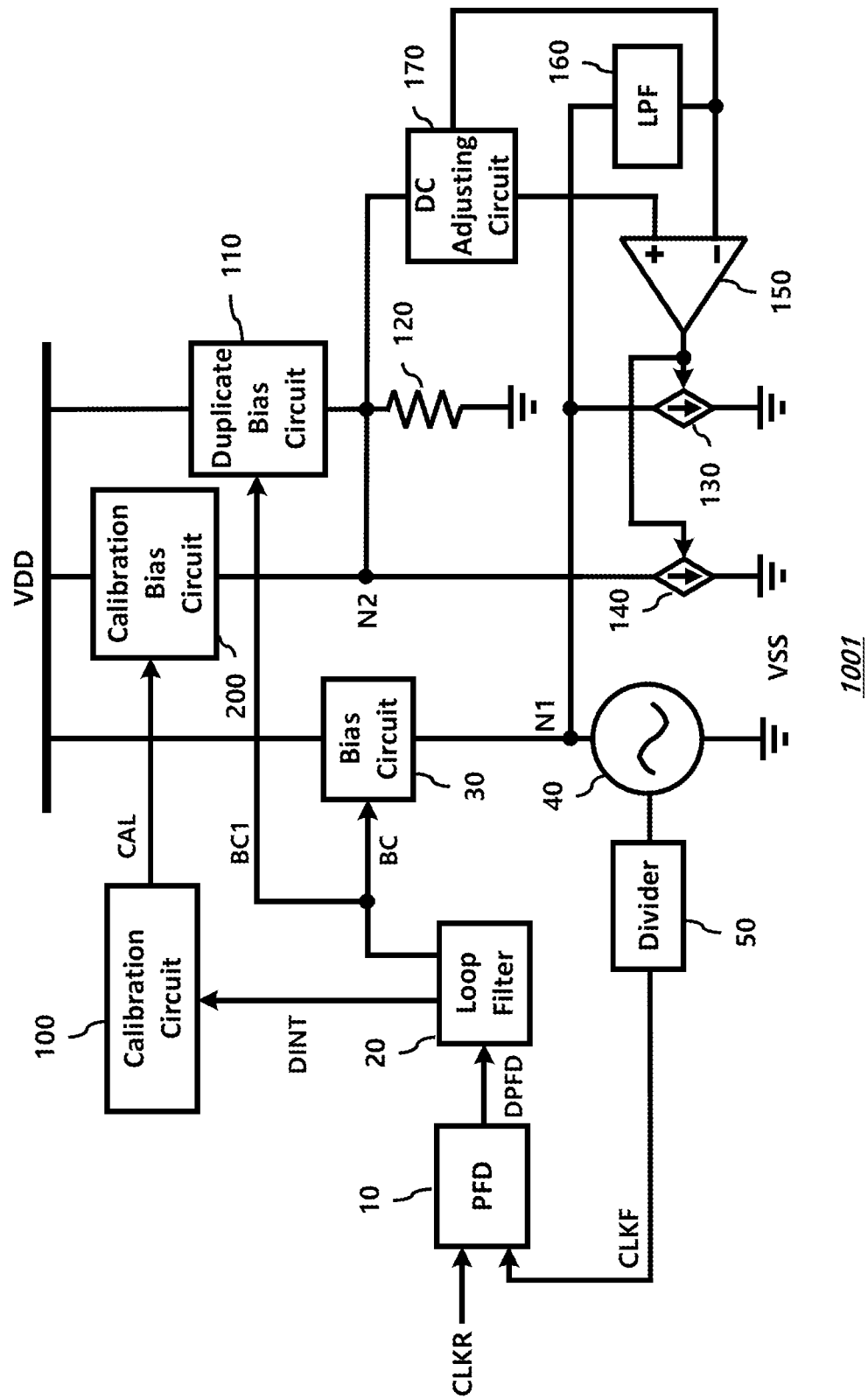
FIG. 3 illustrates a phase-locked loop according to another embodiment of the present disclosure.

FIG. 3 is a block diagram illustrating a phase-locked loop 1001 according to another embodiment of the present disclosure.

The phase-locked loop 1001 further includes a calibration circuit 100 and a calibration bias circuit 200.

The loop filter 20 provides the calibration control signal DINT to the calibration circuit 100, and the calibration circuit 100 uses the calibration control signal DINT to generate the calibration signal CAL.

The calibration bias circuit 200 is coupled between the first power source VDD and the second node N2 and adjusts the second bias current between the first power source VDD and the second node N2 according to the calibration signal CAL.

The calibration circuit 100 controls the calibration bias circuit 200 according to the calibration signal CAL to additionally compensate for a voltage mismatch between the first node N1 and the second node N2.

Other elements of the phase-locked loop 1001 are substantially the same as those of the phase-locked loop 1000 of FIG. 2, and thus descriptions thereof will not be repeated.

Figure 4:
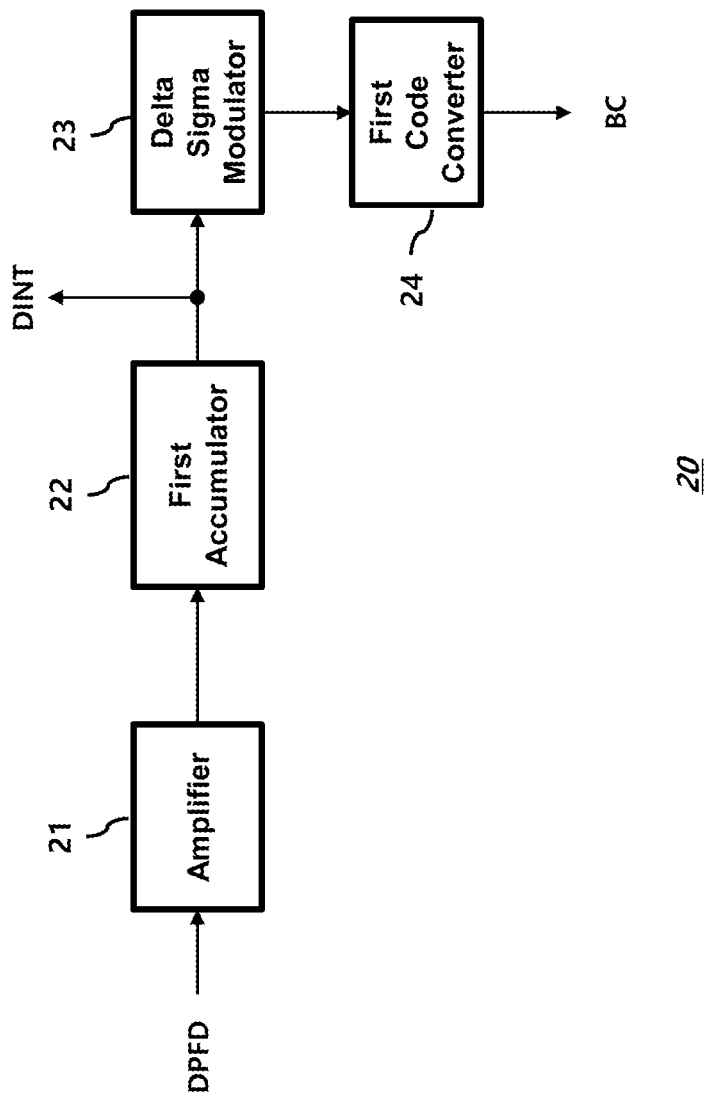
FIG. 4 illustrates a loop filter according to an embodiment of the present disclosure.

FIG. 4 is a block diagram illustrating the loop filter 20 according to an embodiment of the present disclosure.

In this embodiment, the loop filter 20 is a digital filter.

The loop filter 20 includes a first accumulator 22 that accumulates the detection signal DPFD to generate the calibration control signal DINT. The first accumulator 22 counts up when the output of the detection signal DPFD is high, and counts down when the detection signal DPFD is low. A rate of counting of the first accumulator 102 may be determined by the frequency of the feedback clock signal CLKF.

The loop filter 20 may further include an amplifier 21 that amplifies the detection signal DPFD and provides an output thereof to the first accumulator 22.

The loop filter 20 includes a delta sigma modulator 23 that produces an output modulated according to a value of the first accumulator 22, and a first code converter 24 that converts an output of the delta sigma modulator 23 to output the bias control signal BC.

The loop filter 20 may operate with a shorter cycle than that of the feedback clock signal CLKF, which may correspond to a cycle during which the delta sigma modulator 23 modulates its output according to the output of the first accumulator 22.

The first code converter 24 may generate the bias control signal BC in the form of, for example, a thermometer code.

Figure 5:
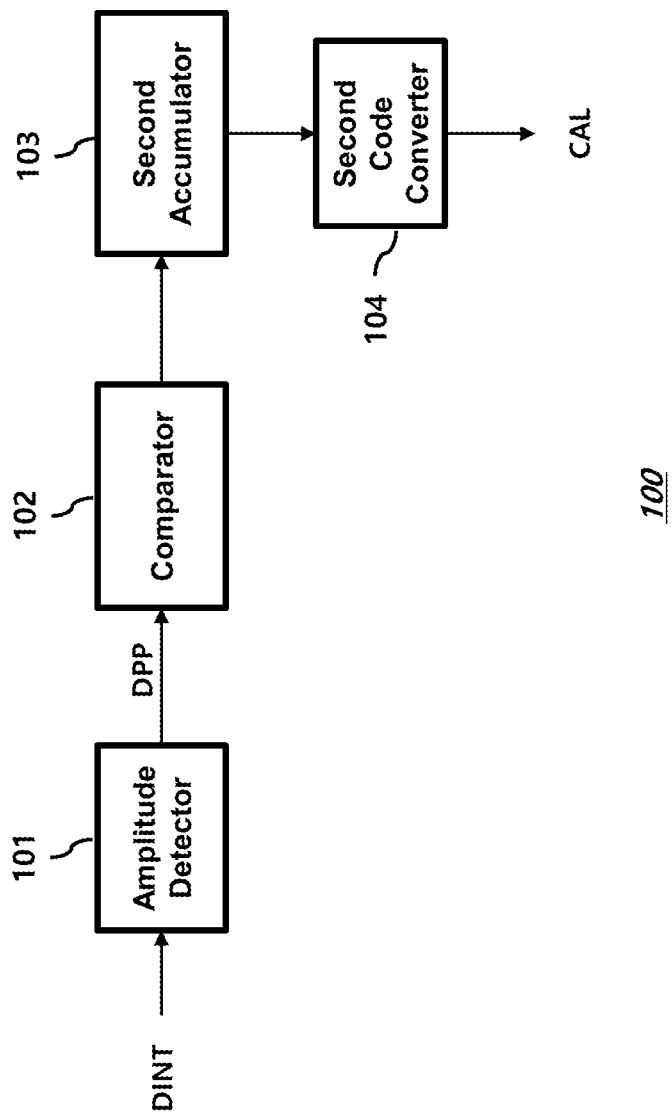
FIG. 5 illustrates a calibration circuit according to an embodiment of the present disclosure.

FIG. 5 is a block diagram illustrating the calibration circuit 100 according to an embodiment of the present disclosure.

The calibration circuit 100 includes an amplitude detector 101 that detects an amplitude of the calibration control signal DINT and outputs an amplitude signal DPP, a comparator 102 that compares the amplitude signal DPP, a second accumulator 103 that generates its output signal in accordance with the output of the comparator 102, and a second code converter 104 for converting an output of the second accumulator 103 to output a calibration signal CAL.

The amplitude detector 101 detects the amplitude by observing the calibration control signal DINT for a predetermined time, which is set longer than a period in which the first accumulator 22 accumulates the detection signal DPFD to acquire the profile of the noise present on the first power supply VDD.

The comparator 102 may compare the amplitude signal DPP and a delayed amplitude signal, which is generated by delaying the amplitude signal DPP for the predetermined time. The second accumulator 103 maintains counting up operation or counting down operation when the output of the comparator 103 is low and switches to counting up operation or counting down operation from previous counting down operation or previous counting up operation, respectively when the output of the comparator 103 is high. The operation period of the second accumulator 103 is the same as the predetermined time of the amplitude detector 101.

The second code converter 104 may generate the calibration signal CAL in the form of, for example, a thermometer code.

Figure 6:
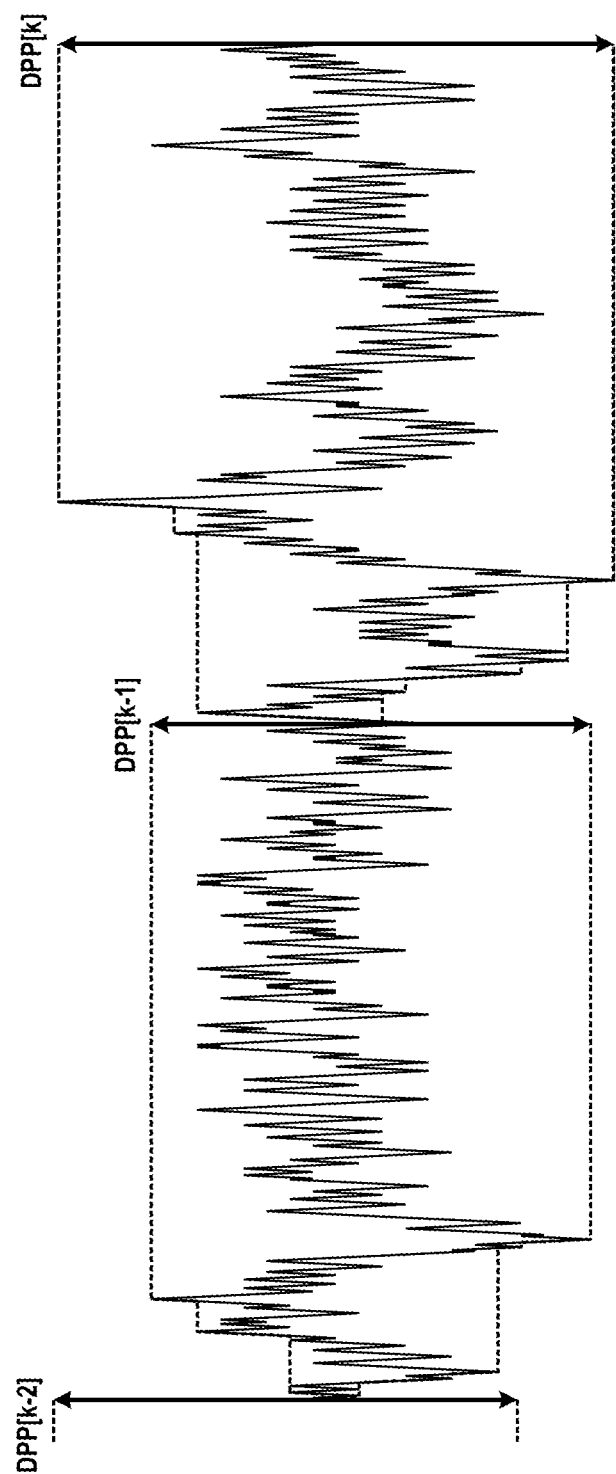
FIG. 6 illustrates an operation of a calibration circuit according to an embodiment of the present disclosure.

FIG. 6 is a graph explaining an operation of the calibration circuit 100.

In the graph, the calibration control signal DINT is indicated by a solid line, and the upper and lower peaks of the calibration signal DINT are indicated by dotted lines.

The amplitude signal DPP corresponds to an amplitude between the upper and the lower peaks of the calibration control signal DINT during a predetermined time.

The amplitude signal DPP is output at regular intervals, and the comparator 102 outputs a comparison result at each interval.

The calibration signal CAL corresponds to a signal generated by accumulating an output of the comparator 102 once or several times.

Although various embodiments have been illustrated and described, various changes and modifications may be made to the described embodiments without departing from the spirit and scope of the invention as defined by the following claims.

What is claimed is:

1. A phase-locked loop, comprising:
   a phase frequency detector configured to compare a reference clock signal and a feedback clock signal and to output a detection signal;
   a loop filter configured to filter the detection signal and output a bias control signal;
   a bias circuit configured to control a first bias current between a first power source and a first node according to the bias control signal;
   an oscillation circuit coupled between the first node and a second power source and configured to generate an oscillation signal according to a current from the first node;
   a divider configured to divide the oscillation signal and to output the feedback clock signal;
   a duplicate bias circuit configured to control a second bias current between the first power source and a second node according to the bias control signal;
   an equivalent impedance circuit coupled between the second node and the second power source;
   a comparator circuit configured to compare respective voltages of the first node and the second node;
   a first variable current circuit configured to control a current between the first node and the second power source according to an output of the comparator circuit; and
   a second variable current circuit configured to control a current between the second node and the second power source according to the output of the comparator circuit.

2. The phase-locked loop of claim 1, further comprising a filter configured to filter a voltage of the first node and to provide an output thereof to the comparator circuit.

3. The phase-locked loop of claim 1, further comprising a DC adjusting circuit configured to adjust a DC component of a voltage of the second node to be the same as a DC component of a voltage of the first node and to provide the adjusted voltage of the second node to the comparator circuit.

4. The phase-locked loop of claim 1, wherein the equivalent impedance circuit has an impedance equivalent to an impedance of the oscillation circuit.

5. The phase-locked loop of claim 1, wherein the equivalent impedance circuit has an impedance equivalent to an impedance of the oscillation circuit adjusted by a predetermined ratio.

6. The phase-locked loop of claim 1, wherein the comparator circuit decreases a current provided by the first variable current circuit and a current provided by the second variable current circuit when a voltage of the first node is higher than a voltage of the second node.

7. The phase-locked loop of claim 1, wherein the loop filter includes:
- a first accumulator configured to accumulate the detection signal for a predetermined time;
- a modulator configured to modulates an output of the first accumulator; and
- a first code converter configured to output the bias control signal according to an output of the modulator.

8. The phase-locked loop of claim 7, wherein the loop filter further includes an amplifier configured to amplify the detection signal and provides an output thereof to the first accumulator.

9. The phase-locked loop of claim 1, further comprises:
- a calibration circuit configured to generate a calibration signal according to the calibration control signal; and
- a calibration bias circuit coupled between the first power source and the second node and configured to adjust the second bias current according to the calibration signal, wherein the loop filter further generates the calibration control signal according to the detection signal.

10. The phase-locked loop of claim 9, wherein the loop filter includes:
- a first accumulator configured to accumulate the detection signal during a first time;
- a modulator configured to modulates an output of the first accumulator; and
- a first code converter configured to output the bias control signal according to an output of the modulator.

11. The phase-locked loop of claim 9, wherein the calibration circuit includes:
- an amplitude detector configured to detect an amplitude of the calibration control signal during a predetermined time and to output an amplitude signal;
- a comparator configured to compare the amplitude signal and a delayed amplitude signal;
- a second accumulator configured to accumulate an output of the comparator; and
- a second code converter configured to output the calibration signal according to an output of the second accumulator.

12. The phase-locked loop of claim 1, wherein the duplicate bias circuit is controlled by a first bias control signal generated from the bias control signal.

* * * * *